United States Patent
Avraham et al.

(10) Patent No.: US 11,755,407 B2
(45) Date of Patent: Sep. 12, 2023

(54) MULTI-RATE ECC PARITY FOR FAST SLC READ

(71) Applicant: Western Digital Technologies, Inc., San Jose, CA (US)

(72) Inventors: Dudy David Avraham, Even Yehuda (IL); Ran Zamir, Ramat Gan (IL); Eran Sharon, Rishon Lezion (IL)

(73) Assignee: Western Digital Technologies, Inc., San Jose, CA (US)

( * ) Notice: Subject to any disclaimer, the term of this patent is extended or adjusted under 35 U.S.C. 154(b) by 2 days.

(21) Appl. No.: 17/331,346

(22) Filed: May 26, 2021

(65) Prior Publication Data
US 2022/0385303 A1    Dec. 1, 2022

(51) Int. Cl.
G06F 11/10 (2006.01)
H03M 13/09 (2006.01)
H03M 13/11 (2006.01)

(52) U.S. Cl.
CPC ....... *G06F 11/1068* (2013.01); *H03M 13/098* (2013.01); *H03M 13/1105* (2013.01); *H03M 13/118* (2013.01)

(58) Field of Classification Search
None
See application file for complete search history.

(56) References Cited

U.S. PATENT DOCUMENTS

| | | | |
|---|---|---|---|
| 3,762,798 A | 10/1973 | Grubb et al. | |
| 7,802,172 B2 | 9/2010 | Vila Casado et al. | |
| 8,458,515 B1 * | 6/2013 | Saeed | G06F 11/1076 714/6.24 |
| 8,566,667 B2 | 10/2013 | Hu et al. | |
| 9,768,808 B2 | 9/2017 | Sprouse et al. | |
| 10,432,232 B2 | 10/2019 | Zamir et al. | |
| 10,700,707 B2 | 6/2020 | Kim | |
| 2010/0185914 A1 * | 7/2010 | Tan | H03M 13/1105 714/752 |

(Continued)

OTHER PUBLICATIONS

Lim et al. "A Stepwise Rate-Compatible LDPC and Parity Management in NAND Flash Memory-Based Storage Devices," in IEEE Access, vol. 8, pp. 162491-162506, 2020, doi: 10.1109/ACCESS.2020.3021498.

*Primary Examiner* — Steve N Nguyen
(74) *Attorney, Agent, or Firm* — PATTERSON + SHERIDAN, LLP; Steven H. VerSteeg

(57) ABSTRACT

A data storage device includes a memory device and a controller coupled to the memory device. The controller is configured to create a dual parity matrix. The dual parity matrix includes a full parity form that includes a payload, a first parity portion, and a second parity portion and a reduced parity form that includes the payload and the first parity portion. The second parity portion is 0. The controller is further configured to create an incremental parity construction matrix. The incremental parity construction matrix includes two arrays. A first array includes a first payload portion, a first, first parity portion, and a first, second parity portion and a second array includes a second payload portion, a second, first parity portion, and a second, second parity portion. The incremental parity construction matrix is arranged in either a block triangular construction or a block diagonal construction.

10 Claims, 5 Drawing Sheets

(56) References Cited

U.S. PATENT DOCUMENTS

| | | | | |
|---|---|---|---|---|
| 2015/0127919 A1* | 5/2015 | Baldwin | ............. | G06F 12/0813 |
| | | | | 711/166 |
| 2015/0339187 A1* | 11/2015 | Sharon | ................... | G11C 29/52 |
| | | | | 714/766 |
| 2020/0042223 A1* | 2/2020 | Li | ....................... | G06F 11/1072 |
| 2022/0066876 A1* | 3/2022 | Yeung | ................. | G06F 11/3037 |

* cited by examiner

MULTI-RATE ECC PARITY FOR FAST SLC READ

BACKGROUND OF THE DISCLOSURE

Field of the Disclosure

Embodiments of the present disclosure generally relate to encoding and decoding of data in a data storage device, such as a solid state drive (SSD).

Description of the Related Art

Data in a data storage device is encoded for efficient transmission to and from a memory device as well as for storage in the memory device. Before data may be read back or transmitted to a host device, the encoded data is decoded. When the data is encoded, the data is encoded with parity data and/or error correction code (ECC) data. When the conditions of the memory device are good, such as beginning-of-life or during a single level cell (SLC) read, data maybe read with a lower amount of parity bits. Thus, the amount of data transferred from the memory device to a controller of the data storage device may be reduced. However, the SLC transfer or SLC read may be the bottleneck in the performance of a data storage device.

Because a lower amount of parity may be adequate in certain scenarios, parity data or ECC data may be programmed either in a "tunable ECC" scheme or a "parity puncturing" scheme. The "tunable ECC" scheme provides several ECC data each with a different length and code-rate. The lengths and code-rate may be changed adaptively. However, the length and code-rate are selected up-front and set during programming, which may lead to a limited correction capability as the length and code-rate may not be changed after being selected up-front and set. The "parity puncturing" scheme includes using a longer ECC data and discarding some of the ECC data bits prior to programming. During reading of the data, the ECC decoder may recover the discarded bits. However, the decoding time may be hindered as the ECC decoder may need to spend a lot of time reconstructing the parity bits that were discarded.

Therefore, there is a need in the art for an improved parity encoding that allows for utilization of both a subset of parity bits when conditions allow for and the full parity when the full correction capability is needed.

SUMMARY OF THE DISCLOSURE

The present disclosure generally relates to encoding and decoding of data in a data storage device, such as a solid state drive (SSD). A data storage device includes a memory device and a controller coupled to the memory device. The controller is configured to create a dual parity matrix. The dual parity matrix includes a full parity form that includes a payload, a first parity portion, and a second parity portion and a reduced parity form that includes the payload and the first parity portion. The second parity portion is 0. The controller is further configured to create an incremental parity construction matrix. The incremental parity construction matrix includes two arrays. A first array includes a first payload portion, a first, first parity portion, and a first, second parity portion and a second array includes a second payload portion, a second, first parity portion, and a second, second parity portion. The incremental parity construction matrix is arranged in either a block triangular construction or a block diagonal construction.

In one embodiment, a data storage device includes a memory device and a controller coupled to the memory device. The controller is configured to create a dual parity construction matrix. The dual parity construction matrix includes a full parity form that includes a payload, a first parity portion, and a second parity portion and a reduced parity form that includes the payload and the first parity portion, wherein the second parity portion is 0.

In another embodiment, a data storage device includes a memory device and a controller coupled to the memory device. The controller is configured to create an incremental parity construction matrix. The incremental parity construction matrix includes two arrays. A first array of the two arrays includes a first payload portion; a first, first parity portion; and a first, second parity portion. A second array of the two arrays comprises a second payload portion; a second, first parity portion; and a second, second parity portion. The incremental parity construction matrix is arranged in either a block triangular construction or a block diagonal construction.

In another embodiment, a data storage device includes memory means and a controller coupled to the memory means. The controller is configured to encode data using an encoding matrix, program the data to the memory means, receive a read request to read the data, determine that the read request is a single level cell (SLC) read request, and transfer and decode the data using reduced parity. The encoding matrix includes a dual parity construction or an incremental parity construction. Both the dual parity construction and the incremental parity construction include a first parity portion and a second parity portion. At least one of the first parity portion and the second parity portion is 0.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specifically described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to encoding and decoding of data in a data storage device, such as a solid state drive (SSD). A data storage device includes a memory device and a controller coupled to the memory device. The controller is configured to create a dual parity matrix. The dual parity matrix includes a full parity form that includes a payload, a first parity portion, and a second parity portion and a reduced parity form that includes the payload and the first parity portion. The second parity portion is 0. The controller is further configured to create an incremental parity construction matrix. The incremental parity construction matrix includes two arrays. A first array includes a first payload portion, a first, first parity portion, and a first, second parity portion and a second array includes a second payload portion, a second, first parity portion, and a second, second parity portion. The incremental parity construction matrix is arranged in either a block triangular construction or a block diagonal construction.

Figure 1:
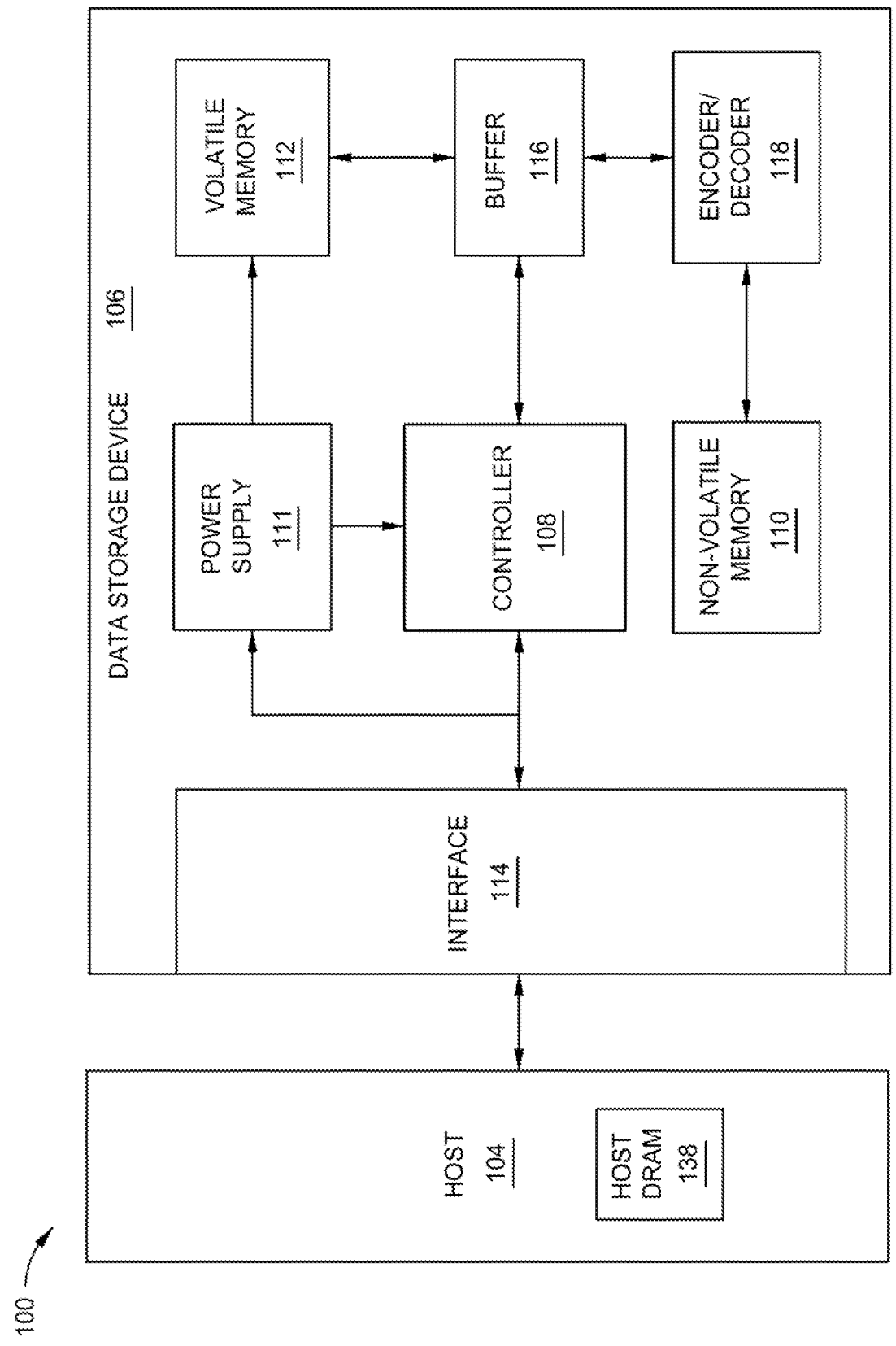
FIG. 1 is a schematic block diagram illustrating a storage system in which a data storage device may function as a storage device for a host device, according to certain embodiments.

FIG. 1 is a schematic block diagram illustrating a storage system 100 in which a host device 104 is in communication with a data storage device 106, according to certain embodiments. For instance, the host device 104 may utilize a non-volatile memory (NVM) 110 included in data storage device 106 to store and retrieve data. The host device 104 comprises a host DRAM 138. In some examples, the storage system 100 may include a plurality of storage devices, such as the data storage device 106, which may operate as a storage array. For instance, the storage system 100 may include a plurality of data storage devices 106 configured as a redundant array of inexpensive/independent disks (RAID) that collectively function as a mass storage device for the host device 104.

The host device 104 may store and/or retrieve data to and/or from one or more storage devices, such as the data storage device 106. As illustrated in FIG. 1, the host device 104 may communicate with the data storage device 106 via an interface 114. The host device 104 may comprise any of a wide range of devices, including computer servers, network attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, or other devices capable of sending or receiving data from a data storage device.

The data storage device 106 includes a controller 108, NVM 110, a power supply 111, volatile memory 112, the interface 114, and a write buffer 116. In some examples, the data storage device 106 may include additional components not shown in FIG. 1 for the sake of clarity. For example, the data storage device 106 may include a printed circuit board (PCB) to which components of the data storage device 106 are mechanically attached and which includes electrically conductive traces that electrically interconnect components of the data storage device 106, or the like. In some examples, the physical dimensions and connector configurations of the data storage device 106 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIe x1, x4, x8, x16, PCIe Mini Card, MiniPCI, etc.). In some examples, the data storage device 106 may be directly coupled (e.g., directly soldered or plugged into a connector) to a motherboard of the host device 104.

The interface 114 may include one or both of a data bus for exchanging data with the host device 104 and a control bus for exchanging commands with the host device 104. The interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. The interface 114 (e.g., the data bus, the control bus, or both) is electrically connected to the controller 108, providing an electrical connection between the host device 104 and the controller 108, allowing data to be exchanged between the host device 104 and the controller 108. In some examples, the electrical connection of the interface 114 may also permit the data storage device 106 to receive power from the host device 104. For example, as illustrated in FIG. 1, the power supply 111 may receive power from the host device 104 via the interface 114.

The NVM 110 may include a plurality of memory devices or memory units. NVM 110 may be configured to store and/or retrieve data. For instance, a memory unit of NVM 110 may receive data and a message from the controller 108 that instructs the memory unit to store the data. Similarly, the memory unit may receive a message from the controller 108 that instructs the memory unit to retrieve data. In some examples, each of the memory units may be referred to as a die. In some examples, the NVM 110 may include a plurality of dies (i.e., a plurality of memory units). In some examples, each memory unit may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, each memory unit may include any type of non-volatile memory devices, such as flash memory devices, phase-change memory (PCM) devices, resistive random-access memory (ReRAM) devices, magneto-resistive random-access memory (MRAM) devices, ferroelectric random-access memory (F-RAM), holographic memory devices, and any other type of non-volatile memory devices.

The NVM 110 may comprise a plurality of flash memory devices or memory units. NVM Flash memory devices may include NAND or NOR based flash memory devices and may store data based on a charge contained in a floating gate of a transistor for each flash memory cell. In NVM flash memory devices, the flash memory device may be divided into a plurality of dies, where each die of the plurality of dies includes a plurality of blocks, which may be further divided into a plurality of pages. Each block of the plurality of blocks within a particular memory device may include a plurality of NVM cells. Rows of NVM cells may be electrically connected using a word line to define a page of a plurality of pages. Respective cells in each of the plurality of pages may be electrically connected to respective bit lines. Furthermore, NVM flash memory devices may be 2D or 3D devices and may be single level cell (SLC), multi-level cell (MLC), triple level cell (TLC), or quad level cell (QLC). The controller 108 may write data to and read data from NVM flash memory devices at the page level and erase data from NVM flash memory devices at the block level.

The power supply 111 may provide power to one or more components of the data storage device 106. When operating in a standard mode, the power supply 111 may provide power to one or more components using power provided by an external device, such as the host device 104. For instance, the power supply 111 may provide power to the one or more components using power received from the host device 104 via the interface 114. In some examples, the power supply 111 may include one or more power storage components configured to provide power to the one or more components when operating in a shutdown mode, such as where power ceases to be received from the external device. In this way, the power supply 111 may function as an on-board backup power source. Some examples of the one or more power storage components include, but are not limited to, capacitors, super-capacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The volatile memory 112 may be used by controller 108 to store information. Volatile memory 112 may include one or more volatile memory devices. In some examples, the controller 108 may use volatile memory 112 as a cache. For instance, the controller 108 may store cached information in volatile memory 112 until the cached information is written to the NVM 110. As illustrated in FIG. 1, volatile memory 112 may consume power received from the power supply 111. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)).

The controller 108 may manage one or more operations of the data storage device 106. For instance, the controller 108 may manage the reading of data from and/or the writing of data to the NVM 110. In some embodiments, when the data storage device 106 receives a write command from the host device 104, the controller 108 may initiate a data storage command to store data to the NVM 110 and monitor the progress of the data storage command. The controller 108 may determine at least one operational characteristic of the storage system 100 and store the at least one operational characteristic in the NVM 110. In some embodiments, when the data storage device 106 receives a write command from the host device 104, the controller 108 temporarily stores the data associated with the write command in the internal memory or write buffer 116 before sending the data to the NVM 110.

The data storage device 106 includes an encoder/decoder 118, such as a low density parity code (LDPC) encoder/decoder. In one embodiment, the encoder/decoder 118 may be a separate unit coupled to the NVM 110. In another embodiment, the encoder/decoder 118 may be a unit coupled directly to the NVM 110, such as in a circuit chip coupled to the NVM 110. Furthermore, it is to be understood that the encoder/decoder 118 may be separate units and the embodiment illustrated is for exemplary purposes. The encoder/decoder 118 may include an internal memory to hold several matrices that include a plurality of error correction codes (ECC). The one or more matrices of the internal memory of the encoder/decoder 118 may allow for fast switching between matrices to avoid any firmware (FW) intervention or performance loss due to the time to switch between matrices.

The encoder/decoder 118 may encode data with a first parity construction matrix or a second parity construction matrix. The first parity construction matrix may be a dual parity construction matrix, where a first parity form is a full parity form and a second parity form is a reduced parity form generated by summing the arrays of the full parity form. The second parity construction matrix may be an incremental parity construction matrix, where a first is a block triangular construction and a second parity form is a block diagonal construction. In the description herein, ECC data and parity data may be referred to as ECC parity data for exemplary purposes.

Figure 2:
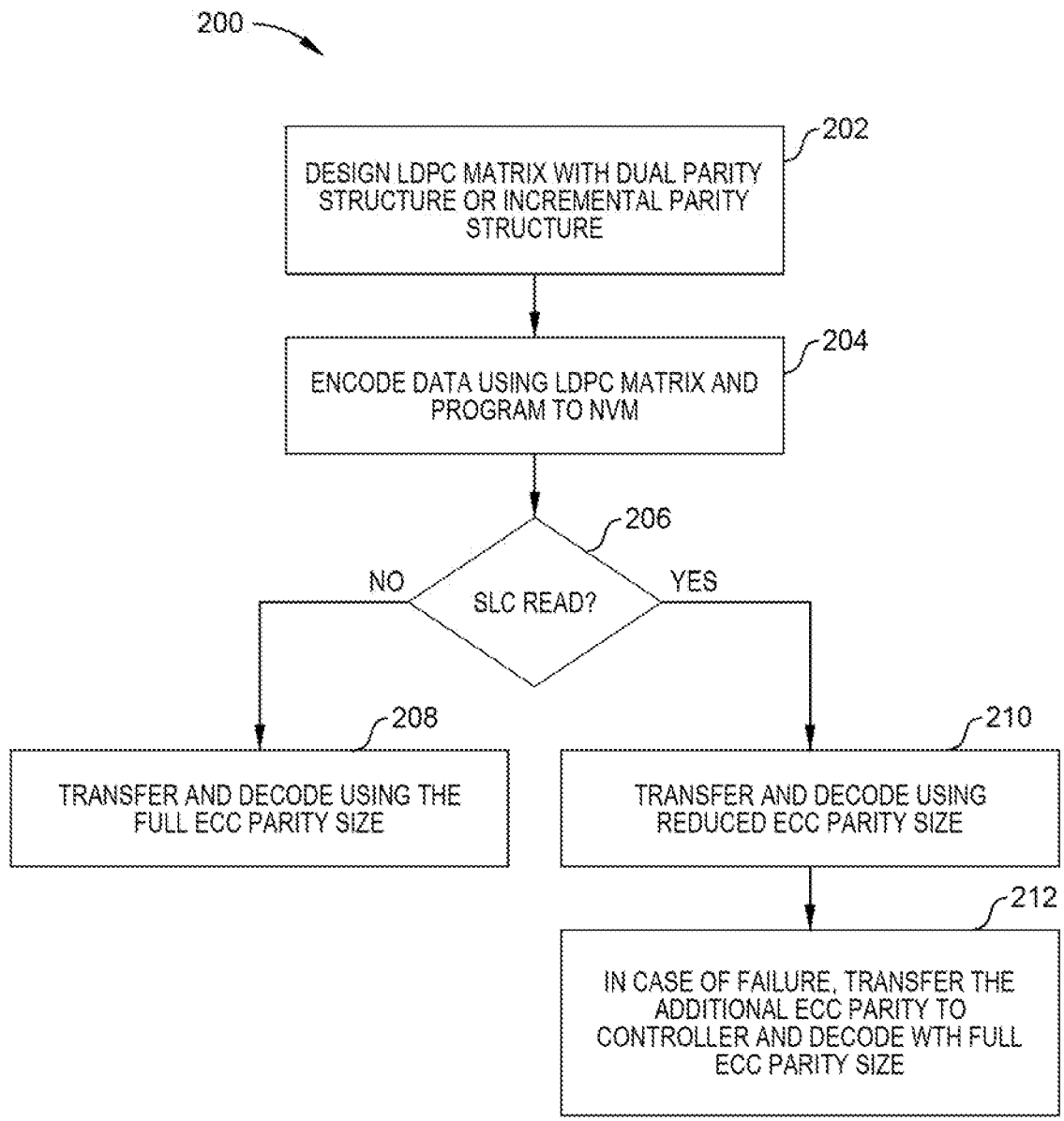
FIG. 2 is a schematic flow diagram illustrating a method of encoding and decoding data, according to certain embodiments.

FIG. 2 is a schematic flow diagram illustrating a method 200 of encoding and decoding data, according to certain embodiments. The method 200 may be executed by the data storage device 104 of FIG. 1. References to aspects of the storage system 100 may be utilized for exemplary purposes. For example, the host device 104 may generate a write command to write data to the NVM 110. The write command is sent to the data storage device via a data bus to the interface 114 and is received by the controller 108. The controller 108 then schedules the write command, where the data of the write command is sent to the encoder/decoder 118.

At block 202, the encoder/decoder 118 designs an LDPC matrix with either a dual parity construction matrix or an incremental parity construction matrix. The dual parity construction matrix may be the construction matrix described in FIGS. 3A and 3B below and the incremental parity construction matrix may be the construction matrix described in FIGS. 4A and 4B below. In one embodiment, the construction matrix of the LDPC matrix may be determined prior to receiving a read command from the host device 104. For example, the controller 108 may determine that the dual parity construction matrix is more beneficial than the incremental parity construction matrix, or vice-versa, due to conditions of the memory device. In another embodiment, the construction matrix of the LDPC matrix may be determined on-the-fly, such as when the read command is received by the controller 108 or when the encoder/decoder 118 receives the data of the read command.

At block 204, the data of the read command is encoded by the encoder/decoder 118 using the selected or determined LDPC matrix and the encoded data is programmed to the relevant location of the NVM 110. After the encoded data is programmed to the NVM 110, the host device 104 may generate a read command to read the encoded data from the NVM 110 or the controller 108 may generate a read command to read the encoded data from the NVM 110 as part of a data management operation such as garbage collection. When the read command is received, the controller 108 determines if the received read command includes a SLC read of the data at block 206.

If the read command does not include a SLC read of the data at block 206, such that the read is executed as a TLC read or a QLC read (depending on the memory type), then the encoded data is transferred to the encoder/decoder 118 and decoded utilizing the full ECC parity size at block 208. However, if the read type is a SLC read at block 206, then the encoded data is transferred to the encoder/decoder 118 and decoded using the reduced ECC parity size at block 210. If the decoding of the encoded data using the reduced ECC parity size fails at block 210, then the additional ECC parity (i.e., the ECC parity not part of the reduced parity construction matrix) is transferred to the encoder/decoder 118 and the encoded data is decoded utilizing the full ECC parity size at block 212.

Figure 3A:
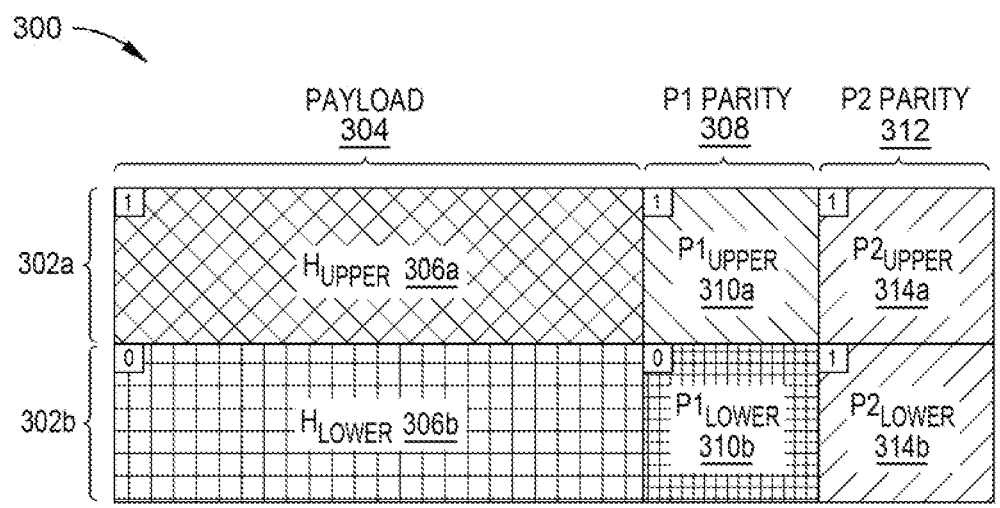
FIG. 3A is a schematic block diagram illustrating a full parity from of a dual parity construction matrix, according to certain embodiments.

FIG. 3A is a schematic block diagram illustrating a full parity form 300 of a dual parity construction matrix, according to certain embodiments. The dual parity construction matrix may be a LDPC parity check matrix. The full parity structure 300 includes a payload 304, a P1 parity portion 308, and a P2 parity portion 312. The payload 304 includes the parity check equations and while the P1 parity portion 308 and the P2 parity portion 312 includes the parity bits of the encoded data. The full parity structure 300 further includes a first array 302a and a second array 302b, where each array 302a, 302b includes the payload 304, the P1 parity portion 308, and the P2 parity portion 312. For example, for the first array 302a, an upper payload portion of the payload 304 is denoted by $H_{UPPER}$ 306a, an upper P1 parity portion of the P1 parity portion 308 is denoted by $P1_{UPPER}$ 310a, and an upper P2 parity portion of the P2 parity portion 312 is denoted by $P2_{UPPER}$ 314a. Likewise, for the second array 302b, a lower payload portion of the payload 304 is denoted by $H_{LOWER}$ 306b, a lower P1 parity portion of the P1 parity portion 308 is denoted by $P1_{LOWER}$ 310b, and a lower P2 parity portion of the P2 parity portion 312 is denoted by $P2_{LOWER}$ 314b.

When constructing the full parity form 300, the $H_{UPPER}$ 306a and the $H_{LOWER}$ 306b matrices are disjointed, such that if a data value or an edge (i.e., a non-zero element in the matrix) appears in one array, the same spot in the alternate array is zero. Likewise, the $P1_{UPPER}$ 310a and the $P1_{LOWER}$ 310b matrices are also disjointed. For example, if the edge appears in a first location of the $H_{UPPER}$ 306a, then the edge of the same location in the $H_{LOWER}$ 306b is equal to 0. In some embodiments, the edge of the same location is non-zero and is not equal to the edge in the first location. Thus, when summing the edges, the resulting value is non-zero. Furthermore, when constructing the full parity form 300, the $P2_{UPPER}$ 314a and the $P2_{LOWER}$ 314b are identical. When summing the arrays between the first array 302a and the second array 302b, identical values are cancelled out and non-identical values are summed. Alternatively, the $P1_{UPPER}$ 310a and the $P1_{LOWER}$ 310b matrices could be identical while the $P2_{UPPER}$ 314a and the $P2_{LOWER}$ 314b are disjointed. Stated another way, at least one of P1 parity portion 308 and P2 parity portion 312 is disjointed while the other is identical.

Furthermore, the first array 302a includes half the values of the payload 304 and the P1 parity portion 306 and the second array 302b includes the remaining half of the values of the payload 304 and the P1 parity portion 308. For example, half of the payload 302 is located in the $H_{UPPER}$ 306a and the other half of the payload 304 is located in the $H_{LOWER}$ 306b. Likewise, half of the P1 parity portion 308 is located in the $P1_{UPPER}$ 308a and the other half of the P1 parity portion 308 is located in the $P1_{LOWER}$ 308b. The $P2_{UPPER}$ 314a includes the entirety of the P2 parity portion 312 and the $P2_{LOWER}$ 314b includes the entirety of the P2 parity portion 312. As noted above, alternatively the $P1_{UPPER}$ 310a and the $P1_{LOWER}$ 310b matrices could include the entirety of the P1 parity portion 308 while the $P2_{UPPER}$ 314a and the $P2_{LOWER}$ 314b each contain half of the P2 parity portion 312.

Figure 3B:
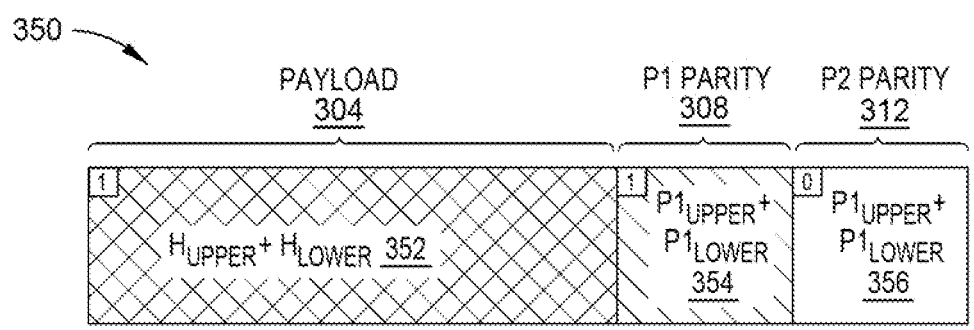
FIG. 3B is a schematic block diagram illustrating a reduced parity form of a dual parity construction, according to certain embodiments.

FIG. 3B is a schematic block diagram illustrating a reduced parity form 350 of a dual parity structure, according to certain embodiments. When the full parity form 300 is summed, the resulting form is represented by the reduced parity form 350. Because the $P2_{UPPER}$ 314a and the $P2_{LOWER}$ 314b are identical, the P2 parity portion 312 cancels out. Therefore, the reduced parity form 350 is a reduced set of equations that does not include the P2 parity portion 312. The reduced parity form 350 includes the payload 304 denoted by $H_{UPPER}+H_{LOWER}$ 352, the P1 parity portion 308 denoted by $P1_{UPPER}+P1_{LOWER}$ 354, and the P2 parity portion 312 denoted by $P2_{UPPER}+P2_{LOWER}$ 356, where the $P2_{UPPER}+P2_{LOWER}$ 356 is equal to 0. As noted above, alternatively, if the $P1_{UPPER}$ 310a and the $P1_{LOWER}$ 310b matrices are identical while the $P2_{UPPER}$ 314a and the $P2_{LOWER}$ 314b are disjointed, the reduced parity form would be a reduced set of equations that does not include the P1 parity portion 308. In such a situation, the reduced parity form would include the payload 304 denoted by $H_{UPPER}+H_{LOWER}$ 352, the P2 parity portion 312 denoted by $P2_{UPPER}+P2_{LOWER}$ 356, and the P1 parity portion 308 denoted by $P1_{UPPER}+P1_{LOWER}$ 354, where the $P1_{UPPER}+P1_{LOWER}$ 354 would be equal to 0.

In an example referring to the full parity form 300, the $H_{UPPER}$ 306a includes a bit value of 1 in a first location, the $P1_{UPPER}$ 310a includes a bit value of 1 in a first location, and the $P2_{UPPER}$ 314a includes a bit value of 1 in a first location. The $H_{LOWER}$ 306b includes a bit value of 0 in a first location, the $P1_{LOWER}$ 310b includes a bit value of 0 in a first location, and the $P2_{LOWER}$ 314b includes a bit value of 1 in a first location. The first locations of the first array 302a are identical to the first locations of the second array 302b. Referring to the reduced parity form 350, the $H_{UPPER}+H_{LOWER}$ 352 includes a bit value of 1 in a first location, the $P1_{UPPER}+P1_{LOWER}$ 354 includes a bit value of 1 in a first location, and the $P2_{UPPER}+P2_{LOWER}$ 356 includes a bit value of 0 in a first location after summing the first array 302a and the second array 302b. Thus, the payload 304 may be decoded without the P2 parity portion 312.

It is to be understood that the sizes of the P1 parity portion 308 and the P2 parity portion 312 may be configurable, such that the parity sizes generated for each parity portion 308 and 312 are appropriate for the data being encoded.

Figure 4A:
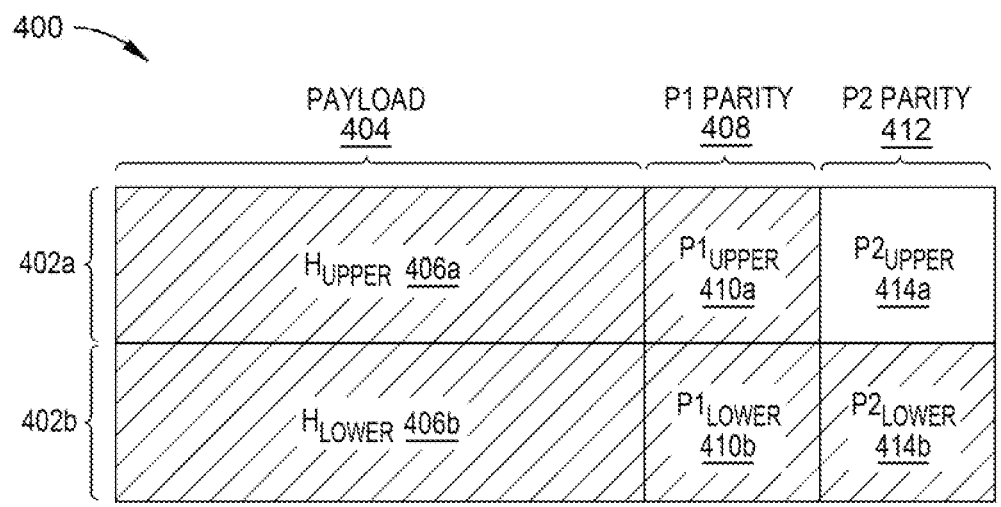
FIG. 4A is a schematic block diagram illustrating a block triangular construction of an incremental parity construction matrix, according to certain embodiments.

FIG. 4A is a schematic block diagram illustrating a block triangular construction 400 of an incremental parity structure, according to certain embodiments. The block triangular construction 400 is constructed as a LDPC parity check matrix, where the arrays (e.g., a first array 402a and a second array 402b) have an uneven number of equations. For example, the first array 402a may be larger than the second array 402b, where the first array 402a includes more data and a larger correction capability than the second array 402b. Alternatively, in one embodiment, the first array 402a may have the same size as the second array 402b, but with each array 402a, 402b having half of the total parity bits. The arrays 402a, 402b may be constructed with regards to a tradeoff between correction-capability and length. The decoding either utilizes all of the parity check equations and all of the parity bits or a partial amount of the parity check equations and a partial amount of the parity bits.

Arrays of the block triangular construction 400 represent the parity check equations and the columns of the block triangular construction 400 represent the code word bits. The arrays include the first array 402a and the second array 402b. The columns include a payload 404, a P1 parity portion 408, and a P2 parity portion 412. The unfilled block (e.g., $P2_{UPPER}$ 414a) represents a zero block, where the zero block does not include any parity bits or parity check equations.

The first array 402a includes an upper payload portion of the payload 404 is denoted by $H_{UPPER}$ 406a, an upper P1 parity portion of the P1 parity portion 408 is denoted by $P1_{UPPER}$ 410a, and an upper P2 parity portion of the P2 parity portion 412 is denoted by $P2_{UPPER}$ 414a. Likewise, for the second array 402b, a lower payload portion of the payload 404 is denoted by $H_{LOWER}$ 406b, a lower P1 parity portion of the P1 parity portion 408 is denoted by $P1_{LOWER}$ 410b, and a lower P2 parity portion of the P2 parity portion 412 is denoted by $P2_{LOWER}$ 414b. Furthermore, the payload 404 is split between the $H_{UPPER}$ 406a and the $H_{LOWER}$ 406b, where the values in each portion may be disjointed.

The second array 402b includes both P1 parity portion 408 and P2 parity portion 412 and the first array 402a includes the P1 parity portion 408. The second array 402b including both the P1 parity portion 408 and the P2 parity portion 412 allows for additional data, such as additional parity bits, and parity check equations to be stored in the block triangular construction 400. The additional parity bits and parity check equations may allow for increased error correction capability. Furthermore, each location of the parity portions 408, 412, if not a zero block, includes at most one half of the parity bits for the respective parity portion.

The location of the zero block (e.g., $P2_{UPPER}$ 414a) in the first array 402a is not intended to be limiting, but to provide an example of a possible embodiment. Rather, the location of the zero block may be in the $P2_{LOWER}$ 414b location, where the $P2_{UPPER}$ 414a location includes parity bits. Furthermore, it is contemplated that the zero block may be located in either the $P1_{UPPER}$ 410a location or $P1_{LOWER}$ 410b location such that only one of the $P1_{UPPER}$ 410a location, the $P1_{LOWER}$ 410b location, the $P2_{UPPER}$ 414a location, or the $P2_{LOWER}$ 414b location is zero.

Figure 4B:
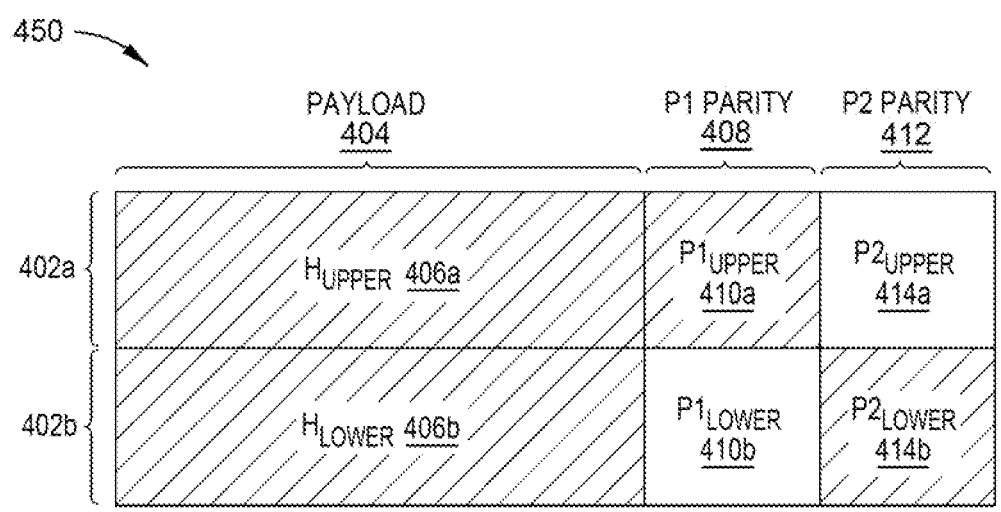
FIG. 4B is a schematic block diagram illustrating a block diagonal construction matrix of an incremental parity construction matrix, according to certain embodiments.

FIG. 4B is a schematic block diagram illustrating a block diagonal construction 450 of an incremental parity structure, according to certain embodiments. Aspects block diagonal construction 450 are similar to the block triangular construction 400 of FIG. 4A. Rather than the second array 402b including both P1 parity portion 408 and P2 parity portion 412, such as in the block triangular construction 400, the second array 402b includes the lower P2 parity portion of the P2 parity portion 412 indicated by $P2_{LOWER}$ 414b and a zero block in the lower P1 parity portion of the P1 parity portion 408 indicated by $P1_{LOWER}$ 410b. Furthermore, the payload 404 is split between the $H_{UPPER}$ 406a and the $H_{LOWER}$ 406b, where the values in each portion may be disjointed.

The location of the zero blocks (e.g., $P2_{UPPER}$ 414a and $P1_{LOWER}$ 410b) in the first array 402a and the second array 402b are not intended to be limiting, but to provide an example of a possible embodiment. Rather, the location of the zero blocks may be in the $P2_{LOWER}$ 414b location and the $P1_{UPPER}$ 410a location, where the $P2_{UPPER}$ 414a location and the $P1_{LOWER}$ 410b includes parity bits. Furthermore, each location of the parity portions 408, 412, if not a zero block, includes at most one half of the parity bits for the respective parity portion.

Figure 5:
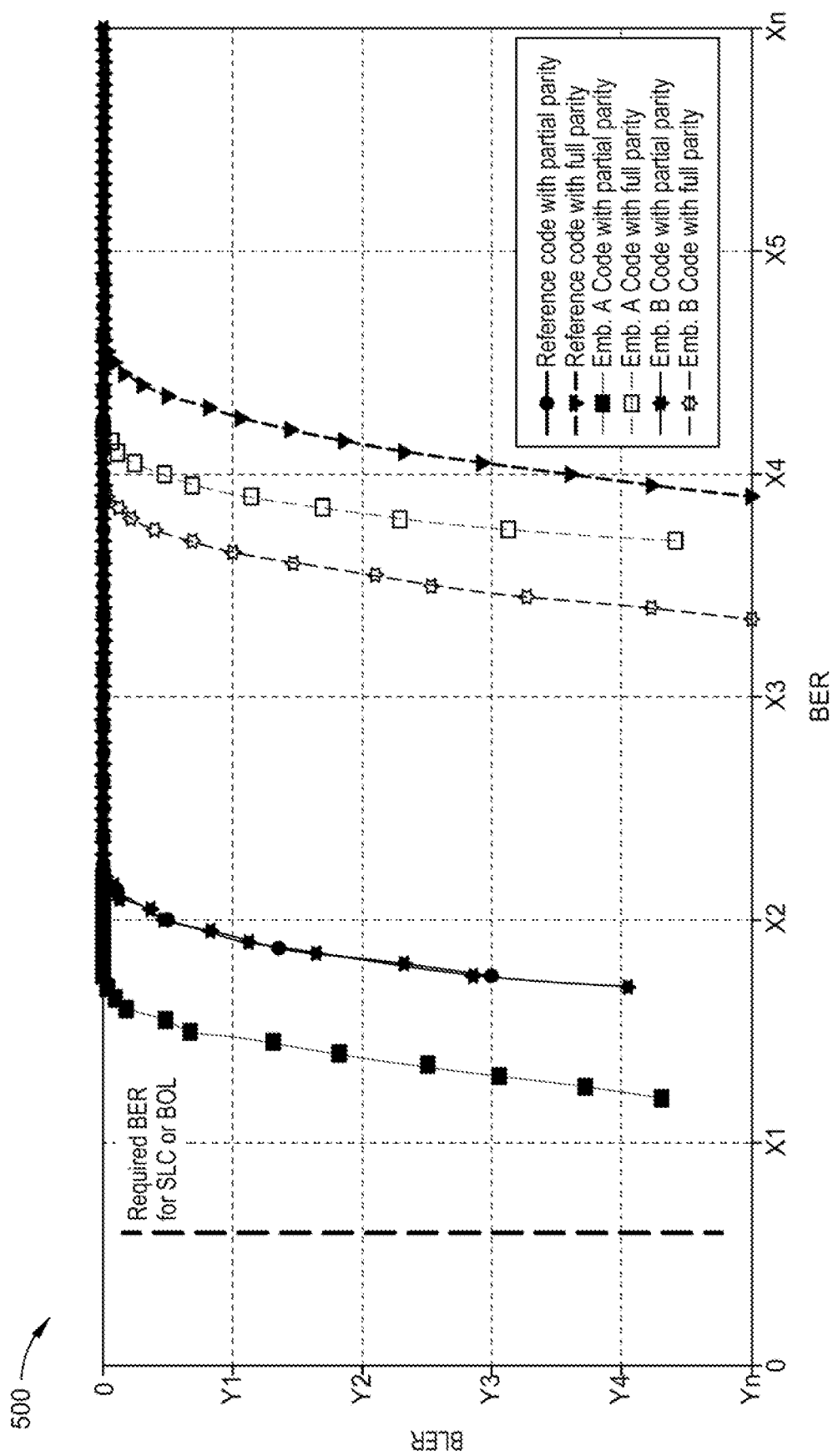
FIG. 5 is a graph illustrating a correction capability of dual-rate parity codes, according to certain embodiments.

FIG. 5 is a graph 500 illustrating a correction capability of dual-rate parity codes, according to certain embodiments. The x-axis indicates the mean bit error rate (BER) (%) and the y-axis indicates the block error rate (BLER). The x-axis range is from 0 to Xn, where Xn is a value greater than 0, and the y-axis range is from Yn to 0, where the y-axis is inversed (i.e., 0 is at the top and Yn is at the bottom of the axis) and Yn is a value greater than 0. It is to be understood that the graph 500 is an exemplary embodiment and the values and/or relationships between curves are not intended to be limiting, but to provide an example of a possible embodiment. The BLER represents the probability that the decoder, such as the decoder portion of the LDPC encoder/decoder 118 of FIG. 1, will fail. When decoding fails, the encoded data may not be decoded due to a high BER. Thus, the encoded data has accumulated too many errors and cannot be read.

Referring to the legend, "Emb. A" refers to the dual parity structures described in FIGS. 3A and 3B, where full parity refers to decoding the data using full parity structure, such as using the full parity form 300, and partial parity refers to decoding the data using a partial parity structure, such as using the reduced parity form 350. Likewise, "Emb. B" refers to the incremental parity structures of FIGS. 4A and 4B, where full parity refers to decoding the data using full parity structure, such as the block triangular construction 400, and partial parity refers to decoding the data using a partial parity structure, such as the block diagonal construction 450. The reference code may refer to "tunable ECC" or "parity puncturing" embodiments.

For SLC reads or beginning-of-life conditions, the target BER is very low or as close to about 0 as possible. Referring to the partial parity embodiments, the "Emb. A" has a lower BER than the reference code and the "Emb. B" has about the same BER as the BER of the reference code. Referring to the full parity embodiments, both the "Emb. A" and the "Emb. B" have a lower BER than the BER of the reference code, where "Emb. B" has a lower BER than the BER of "Emb. A." Thus, for both "Emb. A" and "Emb. B" at both full parity structure and partial parity structure, the BER is lower than if the "tunable ECC" or "parity puncturing" were used. Furthermore, "Emb. A" has better correction capability in full parity mode (e.g., full parity structure, such as the full parity form 300 of FIG. 3A) and "Emb. B" has better correction capability at partial parity mode (e.g., partial parity structure, such as the block diagonal construction 450 of FIG. 4B).

Referring to the method 200, a single ECC parity data may be utilized in two modes: full parity mode and partial parity mode. In a case where decoding with the partial parity structure fails, the full parity structure may still be used as described at block 212 above. Therefore, during decoding, a larger operational margin of correction capability may be achieved.

By reducing the transfer size of the ECC parity during read operations and retaining the ability to decode using either a reduced ECC parity structure or a full parity structure, the reliability of the data storage device may be improved as the correction capability of the LDPC decoder may be increased.

In one embodiment, a data storage device includes a memory device and a controller coupled to the memory device. The controller is configured to create a dual parity construction matrix. The dual parity construction matrix includes a full parity form that includes a payload, a first parity portion, and a second parity portion and a reduced parity form that includes the payload and the first parity portion, wherein the second parity portion is 0.

The full parity form includes the payload arranged in a first half and a second half. The first half includes half of the payload. The second half includes another half of the payload. The first half and the second half are disjointed. The full parity form includes the first parity portion arranged in a first half and a second half. The first half includes half of the first parity portion. The second half includes another half of the first parity portion. The first half and the second half are disjointed. The full parity form includes the second parity portion arranged in a first half and a second half. The first half includes an entirety of the second parity portion. The second half includes the entirety of the second parity portion. The full parity form is divided into two arrays. A first array of the two arrays includes a first half of the payload, a first half of the first parity portion, and the second parity portion. A second array of the two arrays includes a second half of the payload, a second half of the first parity portion, and the second parity portion. The reduced parity includes the first half of the payload added to the second half of the payload, the first half of the first parity portion added to the second half of the first parity portion, and a value of 0 for the second parity portion. The first half of the payload added to the second half of the payload is non zero. The first half of the first parity portion added to the second half of the first parity portion is non zero.

In another embodiment, a data storage device includes a memory device and a controller coupled to the memory device. The controller is configured to create an incremental parity construction matrix. The incremental parity construction matrix includes two arrays. A first array of the two arrays includes a first payload portion; a first, first parity portion; and a first, second parity portion. A second array of the two arrays comprises a second payload portion; a second, first parity portion; and a second, second parity portion. The incremental parity construction matrix is arranged in either a block triangular construction or a block diagonal construction.

The block triangular construction includes a value of 0 for at least one of the first, second parity portion or the second, second parity portion. The block diagonal construction incudes a value of 0 for at least one of the first, first parity portion or the second, first parity portion. The block diagonal construction includes a value of 0 for at least one of the first, second parity portion or the second, second parity portion. A value of 0 is present in each array of the block diagonal construction. The first, first parity portion; the second, first parity portion; the first, second parity portion; and the second, second parity portion each contain at most one half of parity bits for a respective parity portion. The first payload portion and the second payload portion are disjointed.

In another embodiment, a data storage device includes memory means and a controller coupled to the memory means. The controller is configured to encode data using an encoding matrix, program the data to the memory means, receive a read request to read the data, determine that the read request is a single level cell (SLC) read request, and transfer and decode the data using reduced parity. The encoding matrix includes a dual parity construction or an incremental parity construction. Both the dual parity construction and the incremental parity construction include a first parity portion and a second parity portion. At least one of the first parity portion and the second parity portion is 0.

The controller is further configured to transfer and decode the data using full parity upon determining the reduced parity decoding failed. The dual parity construction includes a full parity form arranged in two arrays, a reduced parity form arranged in a single array. A first array of the two arrays including a first payload portion, a first, first parity portion, and a first, second parity portion. A second array of the two arrays includes a second payload portion, a second, first parity portion, and a second, second parity portion. The single array includes a payload portion including the first payload portion added to the second payload portion, a first parity portion including the first, first parity portion added to the second, first parity portion, and a second parity portion including the first, second parity portion added to the second, second parity portion. The second parity portion has a value of 0. The incremental parity construction includes a block triangular construction or a block diagonal construction. The block triangular construction is arranged in two arrays with a first array of the two arrays including a first payload portion, a first, first parity portion, wherein the first, first parity portion comprises one half of the first parity portion, and a first, second parity portion, wherein the first, second parity portion has a value of 0. A second array of the two arrays includes a second payload portion, a second, first parity portion, where the second, first parity portion comprises one half of the first parity portion, and a second, second parity portion, where the second, second parity portion comprises one half of a second parity portion. The block diagonal construction is arranged in two arrays with a first array of the two arrays including a first payload portion, a first, first parity portion, where the first, first parity portion includes one half of the first parity portion, a first, second parity portion, where the first, second parity portion has a value of 0. A second array of the two arrays includes a second payload portion, a second, first parity portion, where the second, first parity portion has a value of 0, and a second, second parity portion, where the second, second parity portion includes one half of a second parity portion.

While the foregoing is directed to embodiments of the present disclosure, other and further embodiments of the disclosure may be devised without departing from the basic scope thereof, and the scope thereof is determined by the claims that follow.

What is claimed is:
1. A data storage device, comprising:
a memory device; and
a controller coupled to the memory device, wherein the controller is configured to:
create a dual parity construction matrix, wherein the dual parity construction matrix comprises:
a full parity form that includes a payload, a first parity portion, and a second parity portion, wherein the full parity form includes the payload arranged in a first half and a second half, wherein the first half comprises half of the payload, wherein the second half comprises another half of the payload, and wherein the first half and the second half are disjointed; and
a reduced parity form that includes the payload and the first parity portion, wherein the second parity portion is 0;
receive a read request for data associated with the dual parity construction matrix;

determine that the read request is a single level cell (SLC) read request; and transfer and decode the data using reduced parity.

2. The data storage device of claim 1, wherein the full parity form includes the second parity portion arranged in a first half and a second half, wherein the first half comprises an entirety of the second parity portion, wherein the second half comprises the entirety of the second parity portion.

3. The data storage device of claim 1, wherein the full parity form is divided into two arrays, wherein a first array of the two arrays comprises:
 a first half of the payload;
 a first half of the first parity portion; and
 the second parity portion.

4. The data storage device of claim 3, wherein a second array of the two arrays comprises:
 a second half of the payload;
 a second half of the first parity portion; and
 the second parity portion.

5. The data storage device of claim 4, wherein the reduced parity comprises:
 the first half of the payload added to the second half of the payload;
 the first half of the first parity portion added to the second half of the first parity portion; and
 a value of 0 for the second parity portion.

6. The data storage device of claim 5, wherein the first half of the payload added to the second half of the payload is non zero.

7. The data storage device of claim 5, wherein the first half of the first parity portion added to the second half of the first parity portion is non zero.

8. A data storage device, comprising:
 a memory device; and
 a controller coupled to the memory device, wherein the controller is configured to:
  create a dual parity construction matrix, wherein the dual parity construction matrix comprises:
   a full parity form that includes a payload, a first parity portion, and a second parity portion, wherein the full parity form includes the first parity portion arranged in a first half and a second half, wherein the first half comprises half of the first parity portion, wherein the second half comprises another half of the first parity portion, and wherein the first half and the second half are disjointed; and
   a reduced parity form that includes the payload and the first parity portion, wherein the second parity portion is 0;

receive a read request for data associated with the dual parity construction matrix;

determine that the read request is a single level cell (SLC) read request; and transfer and decode the data using reduced parity.

9. A data storage device, comprising:
memory means; and
a controller coupled to the memory means, wherein the controller is configured to:
 encode data using an encoding matrix, wherein the encoding matrix comprises:
  a dual parity construction comprising:
   a full parity form, wherein the full parity form is arranged in two arrays, wherein:
    a first array of the two arrays comprises:
     a first payload portion;
     a first, first parity portion; and
     a first, second parity portion;
    a second array of the two arrays comprises:
     a second payload portion;
     a second, first party portion; and
     a second, second parity portion; and
    the first payload portion and the second payload portion each comprises non-zero elements and are disjointed; and
   a reduced parity form, wherein the reduced parity form is arranged in a single array, wherein the single array comprises:
    a payload portion comprising the first payload portion added to the second payload portion;
    a first parity portion comprising the first, first parity portion added to the second, first parity portion; and
    a second parity portion comprising the first, second parity portion added to the second, second parity portion, wherein at least one of the first parity portion and the second parity portion is 0;
 program the data to the memory means;
 receive a read request to read the data;
 determine that the read request is a single level cell (SLC) read request; and
 transfer and decode the data using reduced parity.

10. The data storage device of claim 9, wherein the controller is further configured to transfer and decode the data using full parity upon determining the reduced parity decoding failed.

* * * * *